US012577651B2

(12) United States Patent (10) Patent No.: US 12,577,651 B2
Bienholz et al. (45) Date of Patent: Mar. 17, 2026

(54) FLAT STEEL PRODUCT HAVING AN IMPROVED ZINC COATING

(71) Applicant: THYSSENKRUPP STEEL EUROPE AG, Duisburg (DE)

(72) Inventors: Stefan Bienholz, Bochum (DE); Sebastian Stille, Dortmund (DE); Stefan Krebs, Dortmund (DE); Luis Fernando Piedra-Garza, Essen (DE); Bernd Schuhmacher, Dortmund (DE)

(73) Assignee: THYSSENKRUPP STEEL EUROPE AG, Duisburg (DE)

( * ) Notice: Subject to any disclaimer, the term of this patent is extended or adjusted under 35 U.S.C. 154(b) by 0 days.

(21) Appl. No.: 18/684,100

(22) PCT Filed: Aug. 8, 2022

(86) PCT No.: PCT/EP2022/072237
§ 371 (c)(1),
(2) Date: Feb. 15, 2024

(87) PCT Pub. No.: WO2023/020874
PCT Pub. Date: Feb. 23, 2023

(65) Prior Publication Data
US 2024/0200184 A1 Jun. 20, 2024

(30) Foreign Application Priority Data
Aug. 17, 2021 (DE) ..................... 10 2021 121 343.6

(51) Int. Cl.
C23C 14/16 (2006.01)
B32B 15/01 (2006.01)
(Continued)

(52) U.S. Cl.
CPC ............ *C23C 14/16* (2013.01); *B32B 15/013* (2013.01); *B32B 15/04* (2013.01); *B32B 15/043* (2013.01);
(Continued)

(58) Field of Classification Search
CPC ....... C23C 14/16; C23C 14/021; C23C 14/24; C23C 14/542; C23C 14/562;
(Continued)

(56) References Cited

U.S. PATENT DOCUMENTS 5,747,111 A 5/1998 Fukui et al.
6,475,645 B1 11/2002 Osman et al.
(Continued)

FOREIGN PATENT DOCUMENTS

DE 10 2017 127 987 A1 5/2019
EP 3670697 A1 6/2020
(Continued)

OTHER PUBLICATIONS

Q. Li et al, Surface and Coating Technology 304 (2016) 567-573 (Year: 2016).*
(Continued)

*Primary Examiner* — Michael E. La Villa
(74) *Attorney, Agent, or Firm* — Benesch Friedlander Coplan & Aronoff LLP

(57) ABSTRACT

A flat steel product includes a steel substrate having an anticorrosion coating present at least on one side of the steel substrate and made of zinc or a zinc alloy. This anticorrosion coating, on the surface remote from the steel substrate, has zinc nanocrystals having an average diameter of less than 500 nm. A process for producing such an anticorrosion coating includes producing or providing a steel substrate, continuously introducing the steel substrate into a coating chamber at a reduced pressure, applying an anticorrosion
(Continued)

coating on the steel substrate by physical vapor deposition, and continuously discharging the steel substrate from the coating chamber.

20 Claims, 2 Drawing Sheets

(51) Int. Cl.

| | |
|---|---|
| *B32B 15/04* | (2006.01) |
| *B32B 15/18* | (2006.01) |
| *C23C 14/02* | (2006.01) |
| *C23C 14/24* | (2006.01) |
| *C23C 14/34* | (2006.01) |
| *C23C 14/54* | (2006.01) |
| *C23C 14/56* | (2006.01) |
| *C23C 30/00* | (2006.01) |

(52) U.S. Cl.
CPC ............ *B32B 15/18* (2013.01); *C23C 14/021* (2013.01); *C23C 14/165* (2013.01); *C23C 14/24* (2013.01); *C23C 14/34* (2013.01); *C23C 14/54* (2013.01); *C23C 14/542* (2013.01); *C23C 14/562* (2013.01); *C23C 30/00* (2013.01); *C23C 30/005* (2013.01); *Y10T 428/12799* (2015.01); *Y10T 428/12972* (2015.01); *Y10T 428/12993* (2015.01); *Y10T 428/24942* (2015.01); *Y10T 428/2495* (2015.01); *Y10T 428/24959* (2015.01); *Y10T 428/24967* (2015.01); *Y10T 428/26* (2015.01); *Y10T 428/263* (2015.01); *Y10T 428/264* (2015.01); *Y10T 428/265* (2015.01)

(58) Field of Classification Search
CPC ....... C23C 14/165; C23C 14/34; C23C 14/54; C23C 30/00; C23C 30/005; B32B 15/013; B32B 15/04; B32B 15/043; B32B 15/18; Y10T 428/24942; Y10T 428/2495; Y10T 428/24959; Y10T 428/24967; Y10T 428/24975; Y10T 428/12799; Y10T 428/12993; Y10T 428/12972; Y10T 428/26; Y10T 428/263; Y10T 428/264; Y10T 428/265

See application file for complete search history.

(56) References Cited

U.S. PATENT DOCUMENTS

| | | |
|---|---|---|
| 2009/0098295 A1 | 4/2009 | Riemer et al. |
| 2017/0283937 A1 | 10/2017 | Topalski et al. |
| 2019/0233934 A1 | 8/2019 | Chaleix et al. |
| 2020/0080205 A1 | 3/2020 | Ko et al. |
| 2022/0219430 A1 * | 7/2022 | Takahashi ............. C25D 5/617 |
| 2023/0407455 A1 | 12/2023 | Bienholz |

FOREIGN PATENT DOCUMENTS

| | | |
|---|---|---|
| JP | S64-73070 A | 3/1989 |
| WO | 2019/122131 A1 | 6/2019 |
| WO | WO2020/241866 A1 * | 12/2020 |

OTHER PUBLICATIONS

DIN EN ISO 19403-2, "Paints and varnishes—Wettability—Part 2: Determination of the surface free energy of solid surfaces by measuring the contact angle", Apr. 2020, 20 pages.
DIN 50918 "Corrosion of metals—Electrochemical corrosion tests" Sep. 2018, 15 pages.
Kim, T.Y. et al., "Simultaneous Co-deposition of Zn—Mg Alloy layers on Steel Strip by PVD Process", Corrosion Science and Technology, vol. 10, No. 6(2011), pp. 194~198.
English Translation of International Search Report issued in PCT application No. PCT/EP2022/072237, mailing date Nov. 22, 2022.

* cited by examiner

FLAT STEEL PRODUCT HAVING AN IMPROVED ZINC COATING

CROSS REFERENCE TO RELATED APPLICATIONS

This application is a U.S. National Stage Entry of International Patent Application Serial Number PCT/EP2022/072237, filed Aug. 8, 2022, which claims priority to German Patent Application No. DE 102021121343.6 filed Aug. 17, 2021, the entire contents of both of which are incorporated herein by reference.

FIELD

The invention relates to a flat steel product comprising a steel substrate having an anticorrosion coating present at least on one side of the steel substrate and made of zinc or a zinc alloy. The invention likewise relates to a process for producing such a flat steel product.

BACKGROUND

"Flat steel products" in the present text are understood to mean rolled products having a length and width each significantly greater than their thickness. These especially include steel strips and steel sheets or blanks.

Such flat steel products are nowadays typically galvanized when used in automobile construction, in order to assure protection from corrosion. The galvanization is applied here by hot dip coating, by electrolytic means or by vapor deposition. However, galvanized flat steel products have the disadvantage that they have low paint adhesion without aftertreatment. There is therefore generally an aftertreatment, for example a phosphation, in order to assure good paint adhesion.

DETAILED DESCRIPTION

Figure 1:
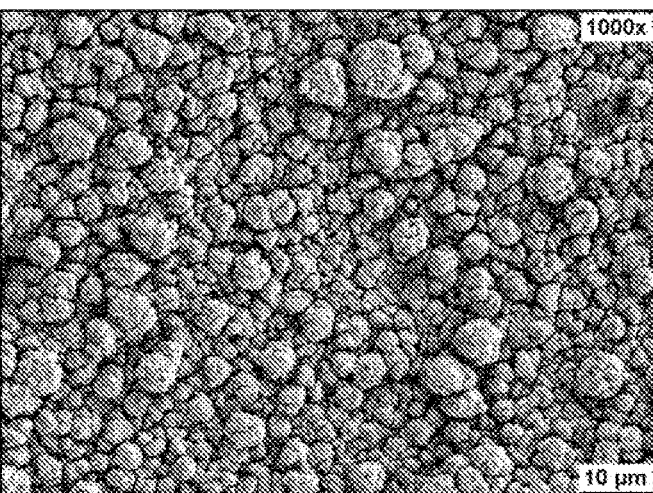
FIG. 1 is a scanning electron micrograph of the anticorrosion coating (1000× magnification)

It is an object of the present invention to provide a galvanization having improved surface properties.

The object is achieved by a flat steel product comprising a steel substrate having an anticorrosion coating present at least on one side of the steel substrate and made of zinc or a zinc alloy. The anticorrosion coating, on the surface remote from the steel substrate, has zinc nanocrystals having an average diameter of less than 500 nm. In particular, the average diameter is more than 50 nm, preferably more than 70 nm, more preferably more than 80 nm, especially more than 100 nm.

In the context of this application, an "anticorrosion coating made of zinc" is understood to mean an anticorrosion coating which, aside from zinc, contains solely unavoidable impurities, i.e. consists of zinc and unavoidable impurities.

In the context of this application, an "anticorrosion coating made of a zinc alloy" is understood to mean an anticorrosion coating consisting of not more than 50% by weight of alloy elements, the balance being zinc and unavoidable impurities.

More preferably, such an anticorrosion coating consists of not more than 40% by weight, especially not more than 30% by weight, preferably not more than 10% by weight, of alloy elements, the balance being zinc and unavoidable impurities.

The alloy elements are preferably selected from the group of aluminum, alkaline earth metals, semimetals.

A proportion of alloy elements in % by weight should be understood to mean the sum total of the percentages by weight of all alloy elements.

"Unavoidable impurities" in a steel alloy, zinc alloy or other alloy refer in the present text to technically unavoidable accompanying substances that get into the steel or coating in the course of production or cannot be removed completely, but the contents of which are in any case so low that they have no effect on the properties of the steel or coating.

In the present text, unless explicitly stated otherwise, figures for the contents of alloy constituents (for example the zinc alloy) are always given in % by weight (% by wt.).

The average diameter of the zinc nanocrystals is ascertained by computer-assisted image analysis. For this purpose, a scanning electron micrograph of a measurement field of 5 µm×5 µm of the surface is created at a magnification of 15 000. By image analysis, the edges of the zinc nanocrystals are determined, and a diameter is ascertained for each crystal. The average of all diameters in the measurement field is the average diameter of the zinc nanocrystals.

Occasionally, there can be misidentifications in the image analysis if individual lumps (see below) are identified as zinc nanocrystals and included in the consideration. In order to rule this out, a histogram of the diameters ascertained is used. In the case of misidentifications, there is a second peak in the histogram at the greater lump diameters. These data can then be excluded by means of the histogram by choosing a suitable cut-off in the histogram.

The inventive arrangement of zinc nanocrystals having an average diameter of less than 500 nm on the surface remote from the steel substrate has various positive effects.

The zinc nanocrystals lead to an irregular surface on a very small scale. This leads to an improvement in wettability and direct paintability without the need for additional phosphation.

A further result is an improvement in electrochemical properties. Thus, the anticorrosion layer of the invention has a more positive potential in a mildly corrosive medium than conventional zinc layers. The anticorrosion layer thus behaves less as a base metal owing to an oxide layer that leads to passivity and has less of a tendency to corrosion. One could expect this to have the effect of reducing active corrosion protection with respect to the steel substrate. However, it has been found that, surprisingly, this is actually more than compensated for by the irregular surface structure. The extremely elevated size of the surface area by virtue of zinc nanocrystals leads to an increase in surface reactivity by comparison with conventional zinc layers. In the case of damage to the surface, therefore, the active protection from corrosion by the zinc for the steel beneath is actually greater than for conventional zinc layers.

In a preferred embodiment, the flat steel product is developed such that the surface of the anticorrosion coating remote from the steel substrate has a lumpy microstructure having an average lump size between 1 μm and 5 μm and a nanostructure, where the nanostructure is formed by the zinc nanocrystals.

The average lump size is ascertained by computer-assisted image analysis. For this purpose, a scanning electron micrograph of a measurement field of 50 μm×50 μm of the surface is created at a magnification of 1000. By image analysis, the edges of the lumps are determined and a diameter is ascertained for each lump. The average of all diameters in the measurement field is the average lump size.

The surface of the anticorrosion coating remote from the steel substrate thus has two main structures: a coarser structure on the micrometer scale with lumpy structures and an overlying finer structure on the nanometer scale which is formed by zinc nanocrystals.

In particular, the lumps of the lumpy microstructure are arranged one alongside another in the direction of extent of the steel substrate. This arrangement has the further advantage that continuous microchannels arise between the lumps of the microstructure, through which diffusible hydrogen can escape from the steel substrate.

The microchannels achieve the effect that diffusible hydrogen that has diffused into the steel substrate, for example in the event of a pretreatment prior to the zinc coating, can escape again through the anticorrosion coating and does not remain trapped in the steel substrate. In order to be able to coat an uncoated flat steel product which is typically protected against oxidation with anticorrosion oil, a pretreatment is necessary. The pretreatment is especially a deoiling operation (for example an alkaline degreasing operation in combination with an electrolytic degreasing operation) and a surface processing or activation step (for example a pickling operation). In all such steps, diffusible hydrogen can be absorbed by the steel substrate. A standard zinc coating would hinder this hydrogen from degassing, such that it remains bound within the steel substrate and leads to hydrogen embrittlement. The microstructure of the developed anticorrosion coating with microchannels, by contrast, enables degassing of the hydrogen absorbed.

In a preferred execution variant, the lumps of the lumpy microstructure each take the form of an agglomeration of zinc nanocrystals.

Under the coating conditions described hereinafter, zinc nanocrystals are formed on deposition of the zinc from the gas phase. However, because of the high coating rate, these do not grow further to form larger crystals, and there is instead constant formation of further nanocrystals that add onto the existing crystals. The first nanocrystals function as condensation nuclei. The result is thus agglomerations of zinc nanocrystals arranged one alongside another on the steel substrate. These agglomerations form the lumps of the lumpy microstructure.

In a preferred execution variant, at least 70%, preferably 80%, especially 90%, of the surface area of the anticorrosion coating remote from the steel substrate is covered by the zinc nanocrystals.

The proportion of the surface area covered is ascertained by computer-assisted image analysis. For this purpose, a scanning electron micrograph of a measurement field of 5 μm×5 μm of the surface is created at a magnification of 15 000. The edges of the zinc nanocrystals are determined by image analysis. In addition, the image is divided into a square grid with a gridline spacing of 0.5 μm. The edges of the zinc nanocrystals found are compared with the grid. If one of the edges falls at least partly into one grid element, this grid element is classified as being covered by zinc nanocrystals. In this way, it is possible to define unambiguously for each grid element whether or not it is covered by zinc nanocrystals. The proportion of the grid elements covered then corresponds to the proportion of the surface area covered.

This firstly assures good wettability since it results in high roughness on the nanometer scale, and this secondly brings about an extremely elevated size of the surface area that leads to elevated surface reactivity.

In a preferred embodiment, the surface energy is greater than 50 mN/m, preferably greater than 60 mN/m. In particular, the surface energy has a dispersive component greater than 40 mN/m, especially greater than 45 mN/m, preferably greater than 50 mN/m, especially greater than 55 mN/m.

Wettability of the surface with a liquid (for example a paint) results from the interplay of surface energy of the substrate and surface tension of the liquid. The greater the surface energy and the lower the surface tension, the better the wettability. In order to achieve good wettability for any desired liquids, therefore, a particularly high surface energy is advantageous.

The surface energy of the anticorrosion coating is determined via a contact angle measurement according to DIN EN ISO 19403-2 (2020.04). This involves depositing droplets of a test liquid on the surface. These deposited droplets are used to measure the contact angle, which characterizes the wetting characteristics of the surface with the liquid. Using the contact angles of multiple test liquids, it is possible to determine the surface energy of the corresponding solid (the anticorrosion layer here). The measuring instrument used was the Dataphysics OCA 20 contact angle measuring instrument, including the corresponding software.

The determination of surface energy is conducted on samples with air-stable surface properties, especially a stable native oxide layer, i.e. after a stable state has been established on storage under ambient air, where the surface has a natural oxide layer and the surface properties no longer change over time via reactions with the ambient atmosphere. This state is achieved, for example, by storage at room temperature (unheated storage) in an air atmosphere at least 50% humidity for at least 7 days.

In a preferred execution variant, the electrochemical potential of the anticorrosion coating in an aqueous solution having a pH of 8.4 is at least −0.7 V, preferably at least −0.65 V, i.e. at least −0.7 V or more positive, or at least −0.65 V or more positive.

Electrochemical potential was determined in accordance with DIN standard DIN 50918 (2018.09) ("measurement of resting potential in homogeneous mixed electrodes"). Where absolute values rather than difference values are given for electrochemical potential, this means reference to the standard hydrogen electrode.

The anticorrosion layer of the invention thus has a more positive potential in a mildly corrosive medium than conventional zinc layers. Zinc layers that have been applied electrolytically or by hot dip coating are typically at an electrochemical potential of about −0.8 V. The anticorrosion layer of the invention thus behaves less as a base metal because of its passive properties and so has less of a tendency to corrosion.

In a further-preferred variant, the surface reactivity of the anticorrosion coating in an aqueous solution having a pH of 8.4 is greater than 800 μW/cm$^2$, preferably greater than 1000

μW/cm$^2$, especially greater than 1200 μW/cm$^2$, more preferably greater than 1400 μW/cm$^2$.

Surface reactivity in the context of this application is determined by cyclic voltammetry. This is done by determining the area enclosed by the hysteresis curve from cyclic voltammetry in the first 20 cycles, i.e. the value of the integral over 20 cycles. The size of this area is proportional to the electrochemically accessible and active surface area and, within the scope of the 20 successive cycles, reflects the successive penetration of the electrolyte into the "internal" surface area through pores and on account of the high roughness. The higher the surface reactivity, the stronger the active protection from corrosion by the steel substrate in the event of damage to the anticorrosion layer. At the same time, it becomes clear that the possibility of penetration of the electrolyte into the interior of the zinc layer correlates with the good wettability described above.

As a result, the zinc nanocrystals lead to improved direct paintability without additional phosphation. In addition, because of the specific topography composed of zinc nanocrystals and lumpy microstructure, there is intensive mechanical interlocking of the paint layer with the zinc layer. This is quantified with the aid of undermining U/2. The anticorrosion coating preferably has an average undermining U/2 of less than 15 mm, preferably less than 10 mm, more preferably less than 5 mm, especially less than 3 mm, preferably less than 2 mm, more preferably less than 1.5 mm.

Undermining is measured by scratching the painted flat steel product down to the base material according to Clemen, in order to simulate damage. Subsequently, the sample thus prepared is immersed in a sodium sulfate solution having a concentration of 0.1 mol/L at 40° C. for 24 hours. At the same time, a current of −1.8 mA/mm$^2$ (based on the scratch area) is applied in order to cause paint delamination proceeding from the scratch to proceed in an accelerated manner. Undermining is then measured on the sample thus prepared. This is done by removing the undermined paint with a scalpel. In so doing, the scalpel blade should be held slightly oblique and the coating should be cautiously removed proceeding from the scratch edge up to the zone that still has firm adhesion. Loosely adhering paint particles are removed with tesa no. 4651 tape. The result is a damage profile that can be evaluated by image processing. For this purpose, an image of the corroded scratch is created. In this image, the width of the damage at right angles to the scratch is determined along the scratch. 5 mm at either end of the scratch is not taken into account here. The average undermining U/2 is half the difference between average width ($\overline{B}$) of the damage and original scratch width B$_0$:

$$U/2 = \frac{\overline{B} - B_0}{2}$$

In addition to the advantages described, the surface structure of the invention as described additionally has low abrasion. This was determined with a modified multi-friction test. This involves pulling a sheet metal strip of dimensions 50×700 mm through a tool with high surface pressure. The tool is a flat jaw with a cylinder of diameter 20 mm resting thereon, through which the strip is pulled. The tool material used, 1.3342, here has a hardness HRC>60. The testing speed is 5 mm/min at a constant normal force FN of 5 kN. By contrast with a conventional multi-friction test, the test length is 500 mm, and the sample geometry is 50×700 mm, with prior cleaning and deoiling of the sample strip in an ultrasound bath. Subsequently, the strip sample is oiled in a defined manner with FUCHS Anticorit PL 3802-39 S oil and 1.5 g/m$^2$ per side. Before the start of the test, the tool is cleaned, then the sheet metal strip is pulled through the tool over a length of 500 mm at a speed of 5 mm/s. After the pulling, the surface is assessed visually for abrasion and damage. In the case of the anticorrosion layer of the invention, no damage and only low abrasion is found.

In a preferred execution variant, the anticorrosion coating has a thickness of 1-20 μm, preferably 1-10 μm. More preferably, the thickness is 3-10 μm. In particular, the thickness is at least 5 μm. In addition, the thickness is especially up to 8 μm. Layers below 1 μm typically do not offer sufficient corrosion protection. For typical automobile components made of flat steel products, in the case of a layer thickness of 3 μm or more, sufficient corrosion protection up to the end of the product lifetime is achieved. Up to a thickness of 20 μm, an improvement in corrosion protection is found. Over and above this thickness, there is no further significant improvement. Moreover, excessively thick layers (greater than 20 μm) are not preferred owing to the correspondingly longer coating time and higher material costs. The ranges mentioned have been found to be a good compromise between sufficient corrosion protection and manufacturing costs, which rise with layer thickness.

In a further-preferred variant, the anticorrosion coating composed of zinc or a zinc alloy directly adjoins the steel substrate. There are thus no further layers disposed between the layer of zinc or a zinc alloy and the steel substrate. Zinc or the zinc alloy thus directly adjoins the steel substrate. As a result, the active corrosion protection by the anticorrosion coating is manifested particularly well.

The steel substrate of the flat steel product is preferably a carbon steel, especially with a carbon content of up to 0.5% by weight.

In a first variant, the steel substrate of the flat steel product is especially a high-strength, preferably an ultrahigh-strength, steel. This means that the tensile strength is more than 590 MPa, especially more than 780 MPa. More preferably, the tensile strength is more than 1000 MPa, especially more than 1200 MPa. The higher the tensile strength of the substrate, the greater the relevance of the coating of the invention, since propensity to hydrogen embrittlement and hence to brittle fracture also rises with tensile strength.

In particular, the steel substrate in this variant is formed from a multiphase steel, especially from a complex phase steel (CP) or a dual phase steel (DP) or a martensite phase steel (MS). Complex phase steels have a microstructure consisting for the most part of bainite. CP steels have high tensile strength, but suffer from relatively low formability, which prevents the design of geometrically complex components. Dual phase steels have a microstructure consisting of a combination of hard microstructure constituents (e.g. martensite or bainite) and soft microstructure constituents (e.g. ferrite). DP steels are suitable for complex components because of their combination of high strength and good formability.

In a preferred development of this variant, the steel substrate is composed of a multiphase steel having the following analysis (figures in % by weight):
  C: 0.02-0.25% by weight
  Si: 0.01-2.00% by weight, preferably up to 1.80% by weight
  Mn: 1.00-3.00% by weight, preferably 1.2-2.6% by weight
  Optionally one or more of the following elements:

P: up to 0.05% by weight, preferably up to 0.020% by weight

S: up to 0.01% by weight, preferably up to 0.008% by weight

Al: up to 1.60% by weight, preferably up to 1.00% by weight

Cr: up to 1.00% by weight, preferably up to 0.85% by weight

Cu: up to 0.20% by weight, preferably up to 0.15% by weight

Mo: up to 0.30% by weight, preferably up to 0.23% by weight

N: up to 0.01% by weight, preferably up to 0.010% by weight

Ni: up to 0.30% by weight, preferably up to 0.01% by weight

Nb: up to 0.08% by weight, preferably up to 0.050% by weight

Ti: up to 0.25% by weight, preferably up to 0.130% by weight

V: up to 0.15% by weight, preferably up to 0.020% by weight

B: up to 0.005% by weight, preferably up to 0.004% by weight

Sn: up to 0.05% by weight, preferably up to 0.030% by weight

Ca: up to 0.01% by weight, preferably up to 0.005% by weight balance: iron and unavoidable impurities.

In a second preferred variant, the steel substrate is composed of a thermoforming steel having the following analysis (figures in % by weight):

C: up to 0.20% by weight, preferably up to 0.18% by weight, especially to 0.12% by weight Si: up to 0.70% by weight, preferably up to 0.50% by weight, especially to 0.12% by weight Mn: 0.01% by weight-1.20% by weight, preferably up to 0.60% by weight Optionally one or more of the following elements:

P: up to 0.12% by weight, preferably up to 0.07% by weight, especially up to 0.05% by weight S: up to 0.05% by weight, preferably up to 0.03% by weight Al: 0.005% by weight-0.100% by weight Cr: up to 0.20% by weight, preferably up to 0.10% by weight Cu: up to 0.20% by weight, preferably up to 0.15% by weight Mo: up to 0.05% by weight, preferably up to 0.03% by weight N: up to 0.03% by weight, preferably up to 0.01% by weight Ni: up to 0.50% by weight, preferably up to 0.10% by weight Nb: up to 0.01% by weight, preferably up to 0.005% by weight Ti: up to 0.20% by weight, preferably up to 0.12% by weight V: up to 0.050% by weight, preferably up to 0.015% by weight B: up to 0.010% by weight, preferably up to 0.004% by weight Sn: up to 0.05% by weight, preferably up to 0.030% by weight Ca: up to 0.01% by weight, preferably up to 0.005% by weight balance: iron and unavoidable impurities.

In a preferred execution variant, the anticorrosion coating has been applied by physical vapor deposition (PVD). It has been found that the surface structure of the invention can be achieved in a simple manner in this way.

Typically, for this purpose, a coating material which is initially in solid or liquid form is evaporated by physical processes. This can be accomplished, for example, thermally by direct heating of the coating material (for example by means of an electric arc), by bombardment with an electron or ion beam, or by illumination with a laser beam. In order that the vapor particles of the evaporated coating material can reach the workpiece to be coated and are not lost to the coating by collision with gas particles of the surrounding atmosphere, the process for PVD coating is conducted in a coating chamber under reduced pressure.

This coating method has various advantages. Firstly, such methods are known for introducing very little hydrogen, if any, into the starter substrate as a result of the process. Secondly, there is no need to heat the steel substrate excessively. In the case of hot dip galvanization, the steel substrate, for example, is inevitably heated to temperatures of more than 460° C. (zinc bath temperature). At these temperatures, however, a hard constituent of the substrate microstructure, in particular martensite, is annealed, as a result of which the characteristics of the steel substrate are lost. This is of particular relevance especially for DP steels as steel substrate. Overall, experiments have shown that all above-described steel substrates having correspondingly high tensile strength can be coated faultlessly by vapor deposition.

The object of the invention is further achieved by a process for producing a flat steel product described, having at least the following steps:

producing or providing a steel substrate optionally deoiling the steel substrate optionally pickling the steel substrate optionally heating the steel substrate continuously introducing the steel substrate into a coating chamber at a reduced pressure applying the anticorrosion coating of zinc or a zinc alloy by physical vapor deposition with a coating rate of at least 0.3 μm/s in the coating chamber continuously discharging the steel substrate from the coating chamber.

The coating rate on application of the anticorrosion coating is preferably at least 0.5 μm/s. It has been found that the surface structure of zinc nanocrystals forms because of the higher coating rate. The condensation takes place so quickly that no accretion to form larger crystals is possible; instead, there is constant formation of further nanocrystals that add onto the existing crystals. The first nanocrystals function as condensation nuclei. The result is thus agglomerations of zinc nanocrystals arranged alongside one another on the steel substrate. These agglomerations form the lumps in the lumpy microstructure. In the case of excessively high coating rates, however, the coating process can become unstable. The desired surface structure can be achieved in a particularly reliable process at coating rates between 1.0 μm/s and 100 μm/s, preferably between 2 μm/s and 20 μm/s.

The continuous introduction of the steel substrate into the coating chamber and the continuous discharge of the steel substrate from the coating chamber has the advantage that it is possible in this way to continuously treat and coat steel strips as steel substrate. As an alternative, it would be necessary to introduce steel strips wound into coils into the coating chamber, to evacuate the coating chamber, and to ventilate it again after the coating in order to remove the steel strips. This would be much more complex than continuous introduction and discharge.

A coating chamber having a reduced pressure is understood in the context of this application to mean a coating chamber having a pressure of less than 10% below the atmospheric pressure of the environment.

In a preferred variant, the continuous introduction and/or discharge is implemented by means of at least one barometric liquid lock as described WO 2019/122131 A1.

In an alternative variant, the continuous introduction and/or discharge is implemented by means of at least one roller lock.

In a specifically developed variant, the continuous introduction and/or discharge is effected via two or more locks in the form of lock stages that reduce the pressure stepwise (in the case of introduction) or increase it stepwise (in the case of discharge).

In a developed variant, the temperature of the steel substrate on application of the anticorrosion coating is between 70° C. and 300° C. This likewise enables condensation of zinc nanocrystals in a reliable process with the desired topography.

In a specific development, the applying of the anticorrosion coating takes place in a protective gas atmosphere with a pressure between 1 mbar and 100 mbar, especially between 10 mbar and 100 mbar. The reduced pressure in the coating chamber is thus between 1 mbar and 100 mbar, especially between 10 mbar and 100 mbar. This ensures that less coating material is lost to the coating as a result of scatter at particles in the coating chamber. At the same time, the pressure is within a range achievable with an acceptable level of complexity on industrial scale application in industrial plants, for example in the coating of steel strips.

In particular, the protective gas atmosphere has an oxygen content of less than 5% by volume, preferably less than 2% by volume, especially less than 1% by volume. This ensures that there is no unwanted oxidation of the hot steel substrate. The protective gas atmosphere is preferably an inert gas atmosphere, especially a nitrogen atmosphere and/or an argon atmosphere, meaning that the protective gas atmosphere consists exclusively of an inert gas, especially nitrogen or argon or a mixture of nitrogen and argon and technically unavoidable impurities. Alternatively, the protective gas atmosphere is an inert gas atmosphere with added hydrogen. In that case, the protective gas atmosphere consists of up to 8% by volume of hydrogen, the balance being inert gas (especially nitrogen or argon or a mixture of nitrogen and argon) and technically unavoidable impurities.

In a preferred embodiment, the anticorrosion coating is applied to the steel substrate by physical vapor deposition, by providing the steel substrate in a coating chamber, where the pressure in the coating chamber is regulated. This involves injecting zinc or a zinc alloy as coating material into the coating chamber at an injection site, where the zinc or zinc alloy is adjusted to a temperature.

In a preferred embodiment of the present invention, pressure and temperature are adjusted such that the temperature is above the dew point of the coating material. The coating material is in its gaseous phase at a temperature above its dew point. If the pressure is adjusted, for example increased, the dew point is shifted, for example toward higher temperatures. Appropriate closed-loop control of the temperature ensures that the coating material is in gaseous form.

Figure 2:
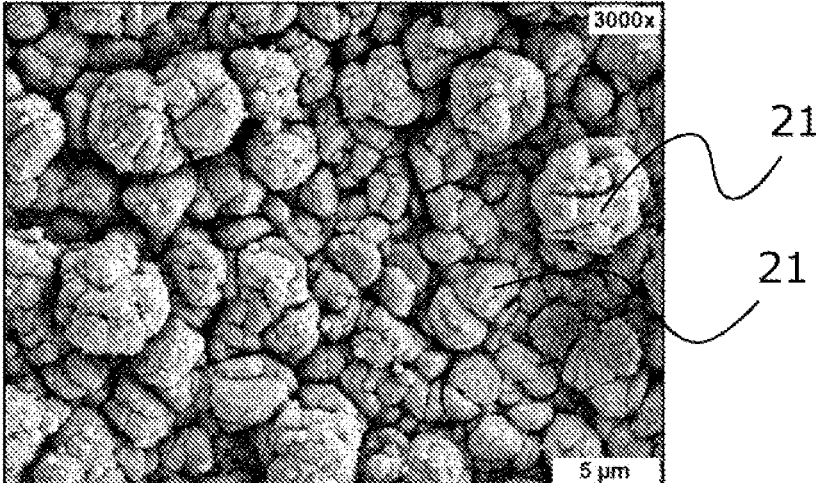
FIG. 2 is a scanning electron micrograph of the anticorrosion coating (3000× magnification)
Figure 3:
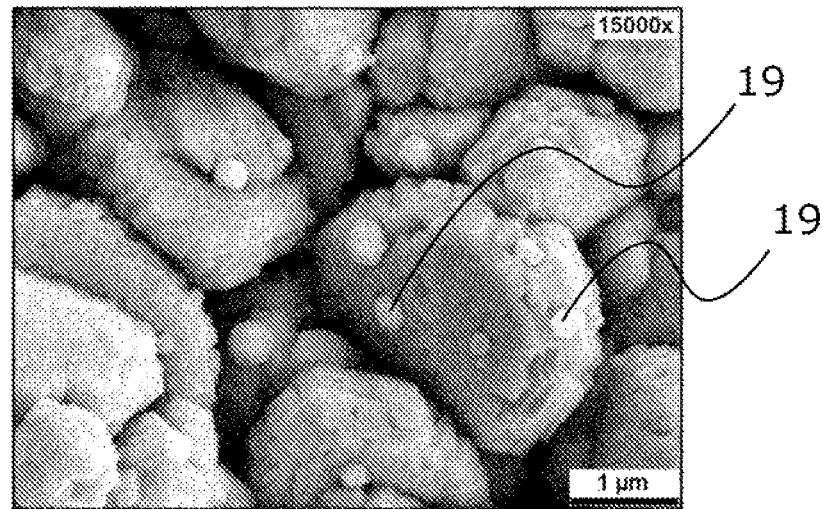
FIG. 3 is a scanning electron micrograph of the anticorrosion coating (15000× magnification)
Figure 4:
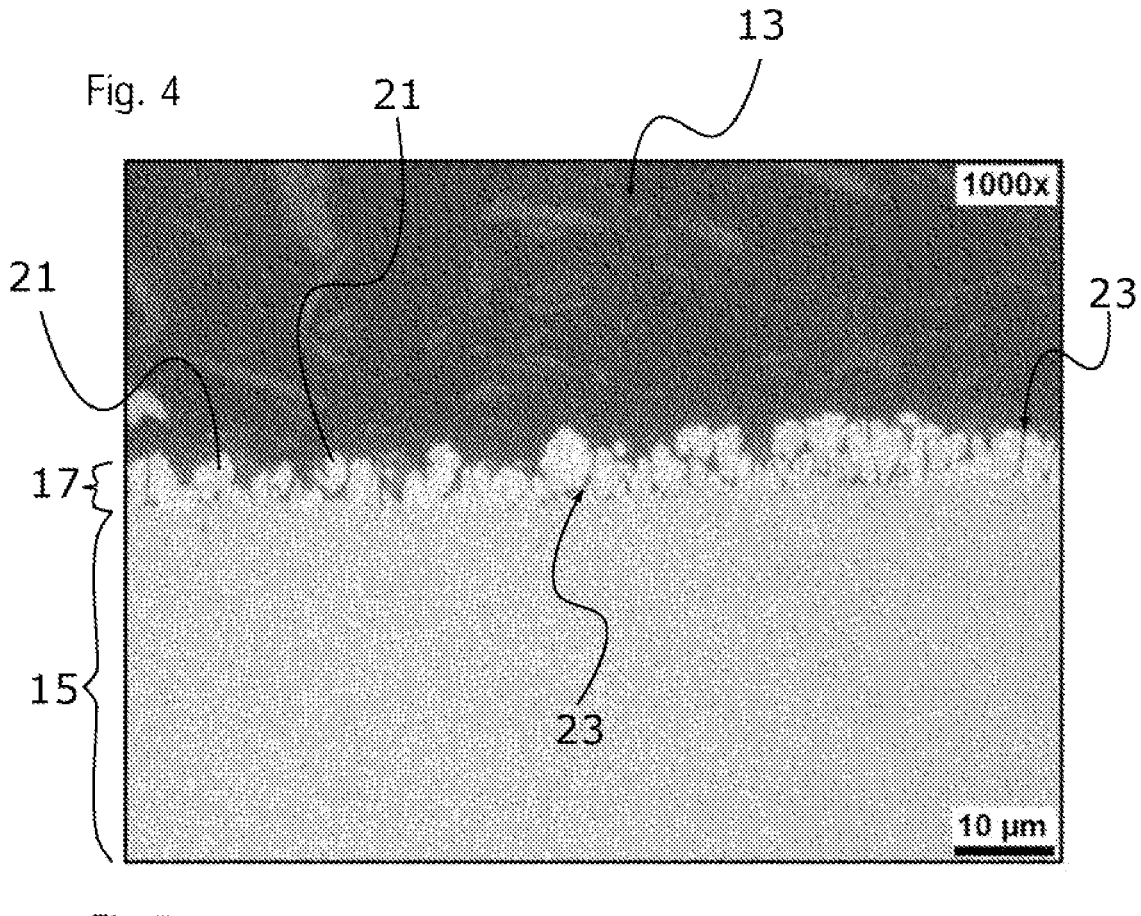
FIG. 4 is a light micrograph of the anticorrosion coating in horizontal section (1000× magnification)

FIGS. 1 to 4 show different views of the same flat steel product 13. FIGS. 1 to 3 each show scanning electron micrographs of the surface of the flat steel product 13 in different magnification. By contrast, FIG. 4 shows a light micrograph of a horizontal section. All images are of working example no. 2 in the tables elucidated hereinafter. The flat steel product 13 comprises a steel substrate 15 having an anticorrosion coating 17 at least on one side of the steel substrate 15. The anticorrosion coating consists of zinc and unavoidable impurities. On the surface remote from the steel substrate 15, the anticorrosion coating has zinc nanocrystals 19 having an average diameter of less than 500 nm. It is clearly apparent in FIG. 3 that the surface is covered essentially completely by zinc nanocrystals 19. Zinc nanocrystals are the honeycomb-shaped structures in FIG. 3. For better clarity, only two selected zinc nanocrystals 19 have been given reference numerals.

The flat steel product 13 comprises a steel substrate 15 having a thickness of 1.8 mm, made from a cold-rolled multiphase steel with analysis A specified below:

C: 0.11% by weight
Si: 0.43% by weight
Mn: 2.44% by weight
P: 0.01% by weight
S: 0.002% by weight
Al: 0.03% by weight
Cr: 0.62% by weight
Cu: 0.05% by weight
Mo: 0.07% by weight
N: 0.004% by weight
Ni: 0.05% by weight
Nb: 0.038% by weight
Ti: 0.022% by weight
V: 0.007% by weight
B: 0.0013% by weight
Sn: 0.02% by weight
Ca 0.002% by weight
Balance: iron and unavoidable impurities.

The same substrate was used in the other working examples in table 1.

It is also apparent from FIGS. 1 to 4 that the anticorrosion coating 17 firstly has the nanostructure described, which is formed by the zinc nanocrystals 19, and secondly has a lumpy microstructure. In FIGS. 2 and 4, two illustrative lumps in each case have been given the reference numeral 21. The lumps 21 in the lumpy microstructure have an average lump size between 1 μm and 5 μm. The lumps 21 in the lumpy microstructure are arranged alongside one another in the direction of extent of the steel substrate. There are therefore continuous microchannels 23 between the lumps 21 of the microstructure, through which diffusible hydrogen can escape from the steel substrate 15.

The surface of the anticorrosion coating 17 which is remote from the steel substrate 15 thus has two main structures: a coarser structure on the micrometer scale with lumpy structures, overlying which is a finer structure on the nanometer scale, which is formed by zinc nanocrystals 19.

In particular, the lumps of the lumpy microstructure are arranged alongside one another in the direction of extent of the steel substrate. This arrangement has the further advantage that continuous microchannels are formed between the lumps of the microstructure, through which diffusible hydrogen can escape from the steel substrate.

FIG. 3, which is in high resolution, shows that the lumps 21 of the lumpy microstructure each take the form of an agglomeration of zinc nanocrystals 19.

Figure 5:
FIG. 5 is a scanning electron micrograph of the anticorrosion coating of a hot dip-coated comparative sample (5000× magnification)
Figure 6:
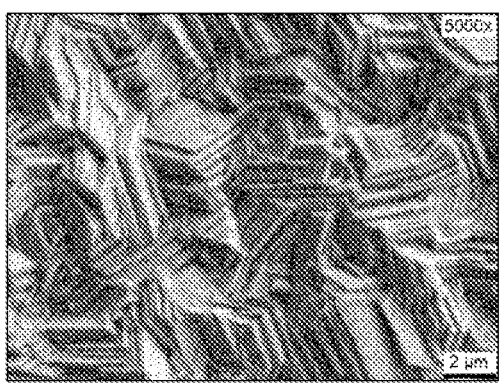
FIG. 6 is a scanning electron micrograph of the anticorrosion coating of an electrolytically coated comparative sample (5000× magnification).

By way of comparison, FIG. 5 shows the surface structure after hot dip coating, and FIG. 6 the surface structure after electrolytic coating. Neither shows any sign of zinc nanocrystals or lumpy microstructure.

Table 1 below shows the indices of the surface created and process parameters in the production thereof from multiple working examples. Samples 1 and 2 have been produced in accordance with the invention by physical vapor deposition (PVD). The coating rate in each case was 4 µm/s. It was only the temperature of the steel substrate that differed. In both cases, the coating was effected in a nitrogen atmosphere, with the technically unavoidable impurities (including oxygen) below 3% by volume. The pressure in the protective gas atmosphere was 50 mbar. Comparative samples produced were a hot dip-coated sample 3 and an electrolytically coated sample 4.

TABLE 1

| Number | Average crystal diameter [nm] | Average lump diameter [µm] | Substrate temperature [° C.] | Coating rate [µm/s] | Thickness of the anticorrosion coating [µm] |
|---|---|---|---|---|---|
| 1 | 178 | 4.3 | 250 | 4 | 7 |
| 2 | 194 | 3.8 | 80 | 4 | 7 |
| 3 | — | — | Hot dip coated | | 7 |
| 4 | — | — | Electrolytically coated | | 8 | active corrosion protection of the steel substrate in the event of damage to the anticorrosion layer.

In addition, the inventive samples show very good direct paintability. This is apparent from the measured undermining U/2. Inventive samples 1 and 2 show average undermining of 1-2 mm. By contrast, this is 19 mm in the case of comparative sample 4. The undermining of 1-2 mm is at a similarly low level to a sample phosphated prior to painting. The penultimate column in table 2 states the level of undermining when the painting has been preceded by a phosphation typical of the automotive sector. The phosphation allows undermining U/2 in the case of the electrolytically galvanized sample 4 to be lowered from 19 mm to 1.3 mm. Samples 1 and 2 already have this order of magnitude without phosphation. Direct paintability is consequently excellent. Undermining was not measured for sample 3. Therefore, the entry in the table reads "n.d." (not determined).

The two inventive samples 1 and 2 additionally have low abrasion, which was confirmed by the modified multi-friction test described.

TABLE 2

| Number | Surface energy [mN/m] | Dispersive component of surface energy [mN/m] | Potential [V] | Surface reactivity [µW/cm2] | Average undermining without phosphation [mm] | Average undermining with phosphation [mm] | Abrasion |
|---|---|---|---|---|---|---|---|
| 1 | 68 | 65 | −0.62 | 1285 | 1.5 | 1.4 | low |
| 2 | 78 | 71 | −0.63 | 1600 | 1.1 | 1.7 | low |
| 3 | 39 | 36 | −0.81 | 249 | n.d. | n.d. | low |
| 4 | 39 | 32 | −0.78 | 712 | 19 | 1.3 | low |

Table 2 below gives the surface properties of the two inventive samples 1 and 2, and some for the reference samples 3 and 4. The surface energies of the inventive samples, at 68 and 78 mN/m (millinewtons per meter), are much greater than for the reference samples. Sample 2 actually has twice as high a surface energy. The same applies to the dominant dispersive component of the surface energy. This achieves better wettability. Surface energy was determined in all four cases on samples with air-stable surface properties. There was no occurrence of any further changes in the surface properties over time. The samples had previously been stored for 7 days without temperature control in an air atmosphere at least 50% humidity.

It is also apparent that the electrochemical potential of the inventive samples is about 20% higher at −0.62 and −0.63 V respectively and is thus more positive than the electrochemical potential of the two reference samples. The potential was determined relative to the standard hydrogen electrode. The anticorrosion layer of the invention thus has a more positive potential in a mildly corrosive medium than conventional zinc layers that have been applied electrolytically or by hot dip coating. The anticorrosion layer of the invention thus behaves as less of a base metal and hence has less of a tendency to corrosion, i.e. shows passive characteristics.

Moreover, the two inventive samples show an extremely elevated surface reactivity of the anticorrosion coating in the abovementioned mildly corrosive medium of 1285 µW/cm² and 1600 µW/cm² respectively. This is a result of the extreme increase in surface area with the surface structure described. Inventive samples 1 and 2 thus show very good

What is claimed is:

1. A flat steel product, comprising:
a steel substrate; and
an anticorrosion coating at least on one side of the steel substrate, wherein the anticorrosion coating is made of zinc or a zinc alloy and has a lumpy microstructure on a surface remote from the steel substrate, wherein the lumpy microstructure comprises nanocrystals and lumps taking a form of an agglomeration of the nanocrystals, and wherein the nanocrystals have an average diameter of less than 500 nm and the lumps have an average lump size between 1 µm and 5 µm.

2. The flat steel product of claim 1, wherein the lumpy microstructure comprises continuous microchannels between the lumps.

3. The flat steel product of claim 1, wherein at least 70% of the surface of the anticorrosion coating remote from the steel substrate is covered with the nanocrystals.

4. The flat steel product of claim 1, wherein a surface energy of the anticorrosion coating is greater than 50 mN/m with a dispersive component greater than 40 mN/m.

5. The flat steel product of claim 1, wherein an electrochemical potential of the anticorrosion coating in an aqueous solution having a pH of 8.4 is at least −0.7 V.

6. The flat steel product of claim 1, wherein a surface reactivity of the anticorrosion coating in an aqueous solution having a pH of 8.4 is greater than 800 µW/cm².

7. The flat steel product of claim 1, wherein the anticorrosion coating has a thickness of 1 µm to 10 µm.

8. The flat steel product of claim 1, wherein the anticorrosion coating is applied by physical vapor deposition.

9. The flat steel product of claim 1, wherein the average diameter of the nanocrystals is between 50 nm and 500 nm.

10. A flat steel product, comprising:

a steel substrate; and an anticorrosion coating at least on one side of the steel substrate, wherein the anticorrosion coating is made of zinc or a zinc alloy and comprises nanocrystals on a surface remote from the steel substrate, wherein an average diameter of the nanocrystals is less than 500 nm, and wherein the anticorrosion coating has at least one of characteristics selected from:

a surface energy of the anticorrosion coating is greater than 50 mN/m with a dispersive component greater than 40 mN/m;

an electrochemical potential of the anticorrosion coating in an aqueous solution having a pH of 8.4 is at least –0.7 V; and a surface reactivity of the anticorrosion coating in an aqueous solution having a pH of 8.4 is greater than 800 $\mu W/cm^2$.

11. The flat steel product of claim 10, wherein the anticorrosion coating further comprises lumps on the surface remote from the steel substrate, the lumps take a form of an agglomeration of the nanocrystals and have an average lump size between 1 $\mu$m and 5 $\mu$m.

12. A process for producing a flat steel product, comprising:

producing or providing a steel substrate;

continuously introducing the steel substrate into a coating chamber at a reduced pressure;

applying an anticorrosion coating on the steel substrate by physical vapor deposition with a coating rate of at least 0.3 $\mu$m/s in the coating chamber, wherein the anticorrosion coating is at least on one side of the steel substrate, the anticorrosion coating is made of zinc or a zinc alloy and has a lumpy microstructure comprising nanocrystals and lumps taking a form of an agglomeration of the nanocrystals, wherein the nanocrystals have an average diameter of less than 500 nm and the lumps have an average lump size between 1 $\mu$m and 5 $\mu$m; and continuously discharging the steel substrate from the coating chamber.

13. The process of claim 12, wherein the coating rate on application of the anticorrosion coating is at least 0.5 $\mu$m/s.

14. The process of claim 12, wherein a temperature of the steel substrate on application of the anticorrosion coating is between 70° C. and 300° C.

15. The process of claim 12, wherein the applying of the anticorrosion coating takes place in a protective gas atmosphere at a pressure between 1 mbar and 100 mbar or between 10 mbar and 100 mbar.

16. The process of claim 15, wherein the protective gas atmosphere has an oxygen content of less than 5% by volume.

17. The process of claim 12, wherein the reduced pressure in the coating chamber is regulated, and wherein the zinc or the zinc alloy as coating material is injected into the coating chamber at an injection site and the coating material is adjusted to a temperature.

18. The process of claim 12, comprising deoiling the steel substrate.

19. The process of claim 12, comprising pickling the steel substrate.

20. The process of claim 12, comprising heating the steel substrate.

* * * * *